US006697245B2

(12) United States Patent
Andrews

(10) Patent No.: US 6,697,245 B2
(45) Date of Patent: Feb. 24, 2004

(54) ELECTRONIC LOAD FOR THE TESTING OF ELECTROCHEMICAL ENERGY CONVERSION DEVICES

(75) Inventor: Craig C. Andrews, College Station, TX (US)

(73) Assignee: Lynntech, Inc., College Station, TX (US)

( * ) Notice: Subject to any disclaimer, the term of this patent is extended or adjusted under 35 U.S.C. 154(b) by 0 days.

(21) Appl. No.: 09/945,366

(22) Filed: Aug. 31, 2001

(65) Prior Publication Data

US 2002/0071232 A1 Jun. 13, 2002

Related U.S. Application Data

(63) Continuation of application No. 09/267,803, filed on Mar. 12, 1999, now Pat. No. 6,324,042.

(51) Int. Cl.[7] .................................................. H02H 3/00
(52) U.S. Cl. ...................... 361/93.2; 361/93.1; 323/426
(58) Field of Search ........................... 361/78, 79, 93.1, 361/93.2; 327/50, 74, 87, 306, 309; 323/426, 425

(56) References Cited

U.S. PATENT DOCUMENTS

| | | |
|---|---|---|
| 3,617,845 A | 11/1971 | McKenna |
| 4,881,037 A | 11/1989 | Bellingham et al. |
| 5,200,692 A | 4/1993 | Krinsky et al. |
| 5,312,538 A | 5/1994 | Metrich |
| 5,512,831 A | 4/1996 | Cisar et al. |
| 5,969,514 A | 10/1999 | Merrill |

OTHER PUBLICATIONS

Landgrebe, Albert R., et al.; "Proceedings of the Symposium on Batteries and Fuel Cells for Stationary and Electric Vehicle Applications"; The Electrochemical Society, Inc.; proceedings vol. 93–98; pp. 258–268.

Hewlett Packard Service Manual—300 Watt Single Input Electronic Load HP Model 6060A—for instruments with Serial Nos. 2926A–00461 and Above; Aug. 1989.
Anantaraman, A. V., et al.; Testing of the Ballard Solid Polymer Electrolyte Fuel Cell; pp. 1–7.
Dubose, Ronald A., P.E.; letter dated Aug. 1, 2002 with attached references consisting of purchase orders and a brochure.
Lawrance, R. J., et al.; "Proton Exchange Membrane Fuel Cell Development"; Treadwell Corporation; pp. 1587–1591.
Baron, F.; "European Space Agency Fuel Cell Activities"; Journal of Power Sources, 29 (1990); pp. 207–221.
Vanderborgh, Nicholas E.; et al.; "PEM Fuel Cell Stack Heat and Mass Management"; pp. 3407–3411.
Tanaka, Toshihide; et al.; Development of Molten Carbonate Fuel Cell Stack at Mitsubishi Electric Corporation; pp. 1535–1539.
Mosdale, Renaut, et al.; "Fabrication of Electrodes for Proton Exchange Membrane Fuel Cells Using a Spraying Method and Their Performance Evaluation"; pp. 179–189.
Giner, Jose, et al.; "Developoment of An Aqueous Carbonate Fuel Cell"; pp. 183–190.
Buchi, Felix. N., et al.; "In–Situ Membrane Resistance Measurements in PEFC by Fast Current Pulses"; pp. 236–255.

(List continued on next page.)

*Primary Examiner*—Kim Huynh
(74) *Attorney, Agent, or Firm*—Streets & Steele; Jeffrey L. Streets; Steven L. Christian

(57) ABSTRACT

In a load for testing an energy production device, such as a fuel cell, a technique is provided for sensing one or more operational parameters for each of a plurality field effect transistors. Analog and digital feedback are provided to adjust the control signal to the FETs to ensure that each remains within its individual safe operating area. The technique preferably takes all of the various operational parameters into account to determine if any individual FET is approaching the SOA boundary, and prevent that single FET from leaving the SOA while continuing to manage the operation of the entire load.

84 Claims, 4 Drawing Sheets

OTHER PUBLICATIONS

Staschewski, D.; "Hydrogen–Air Fuel Cells of the Alkaline Matrix Type: System Studies and Computerized Performance Tests"; pp. 357–367.

Asan, Supramaniam Sriniv; et al.; "Recent Advances in Solid Polymer Electrolyte Fuel Cell Technology with Low Platinum Loading Electrodes"; Journal of Power Sources, 29 (1990); pp. 367–387.

Oliveira, Julio C.T., et al.; "Performance Evaluation of a $H_2$/Air PEM–FC System under Variable Load"; pp. 451–454.

Chamberlin, C.E., et al.; "Preliminary Results of the Schatz Fuel Cell Research Project"; pp. 1659–1665.

Makiel, J. M., et al.; "Testing of a Multi–kwe SOFC Power Generation System"; pp. 523–526.

Booz, Allen & Hamilton, Inc.; "Research, Development and Demonstration of a Fuel Cell/Battery–Powered Bus System Phase 1"; Feb. 28, 1990; Contract DOE–AC08–87NV10650.

Freni, S., et al.; "Structural Modifications of a Spent Molten Carbonate Fuel Cell"; Journal of Applied Electrochemistry 20 (1990); pp. 804–810.

Gulzow, E., et al.; "Preparation and Characterization of Gas Diffusion Electrodes for Alkaline Fuel Cells"; pp. 453–456.

ELECTRONIC LOAD FOR THE TESTING OF ELECTROCHEMICAL ENERGY CONVERSION DEVICES

"This is a continuation of copending application (s) Ser. No. 09/267,803 filed on Mar. 12, 1990," now U.S. Pat. No. 6,324,042 issued Nov. 23, 2001.

FIELD OF THE INVENTION

The present invention relates generally to the field of testing equipment, and, more particularly, to a method and apparatus for applying a variable load to electrochemical energy conversion and storage devices, such as fuel cells and batteries.

BACKGROUND OF THE INVENTION

Known equipment for the testing of electrochemical energy generating and storage devices, such as fuel cells and batteries, suffer from one or more of several drawbacks. For example, known testing systems provide inadequate control of the amount of energy consumed in a load under test coupled to such an energy source. The present invention provides a resistive load used to controllably consume the electrical energy produced or stored by an electrochemical device.

The simplest known system, now rarely used, provides a network of switches and resistors as a test load. Each resistor is in series with a switch, and each resistor-switch pair is in parallel with all of the others. As each switch is closed, the total resistance of the network drops. The resistors may be identical in resistance, or they may provide different resistances to allow finer control of the total resistance of the load. Such a system includes a large number of mechanical contacts brought to the circuit with the switches. Each mechanical contact adds a varied and changing resistance to the network. In a large network, consisting of a dozen or more switches, the network resistance will seldom be exactly the same twice. The unavoidable mechanical wear that occurs during use of such a system only adds to the problem by changing the resistance of different switches differently. Such a system may be improved by the addition of a variable potentiometer in parallel with the switches, but this only replaces one set of mechanical components for another, with all its inherent drawbacks.

The test array just described may be improved by replacing the switches and resistors with field effect transistors (FETs). An FET is a voltage controlled device having a linear region of its operating characteristic and a saturated region at higher input voltages. In the linear region, a FET emulates a resistor having a resistance that can be varied over a wide range through the application of a bias voltage to one terminal of the device. In its simplest form, an FET-based electronic load, which generally consists of a set of FETs mounted in parallel, is controlled by manually adjusting the gate voltage to produce the desired current flow through the system. This system is a distinct improvement on a resistor network. It eliminates the switch contact problems and provides virtually infinite variability in resistance over the available load range. However, such a system requires manual operation to change the output of the system including periodic readjustments to offset variations produced by thermal effects in the circuit or variations in the performance of the source under test.

The circuit can be stabilized by the addition of analog circuitry tuned to measure and compensate for the external changes. This circuit can be sufficiently complex to hold a constant current through changes in the performance of the device under test and to provide for external control of the load via an analog voltage supplied from an external source. A load of this type permits automation of the test system, however it is relatively complex. The large number of components involved increases the difficulty in fabrication and increases the chance of at least one component malfunctioning. The difficulty in fabrication and the number of components make this system expensive to produce and difficult to maintain.

Commercially available electronic loads such as those produced by Hewlett Packard, have been used as loads for fuel cell and battery testing. While they are a distinct improvement on the loads described above, they are still deficient in several respects. They typically have maximum current capabilities on the order of 120 amps. While this is adequate for the uses they were designed for, it is insufficient for a high power density fuel cell. A 50 $cm^2$ fuel cell operating at 3 $A/cm^2$ puts out 150 Amps, and some systems are routinely operated at up to 4 $A/cm^2$, while many developers use cells with larger areas. These units also have a second deficiency when used to test either single cell fuel cells or batteries. Since they were not designed for fuel cell testing or single cell battery testing, they were designed to operate with a typical minimum potential of 3 Volts. If operated at lower voltages, the maximum current capacity is substantially reduced. Most fuel cells reach their maximum power output at around 0.6 Volts, and at this voltage a 120 Amp load's capacity is reduced to about 40 Amps. This can be overcome by placing a power supply in series with the fuel cell or battery being tested to boost the voltage. While this works, there is some risk involved. For instance, when the device under test is a fuel cell, if the gas supply to a fuel cell is cut off, the cell voltage can go to zero. Since the power supply is still applying a voltage, it is possible for the cell to be forced into reverse and become an electrolyzer. In this mode the cell will generate hydrogen in the compartment that had previously contained oxygen, and oxygen in the one that had contained hydrogen. This can form an explosive mixture in either compartment. This is a situation that is to be avoided.

Still another type of electronic load can be constructed using a high speed chopper to turn the current through a fixed resistor on and off at high frequency (>1000 Hz). When the chopper is on, the current flows at the same level as if the resistor were connected directly to the fuel cell. When the chopper is off the current flow is zero. The duty cycle of the chopper is adjusted so that the total coulomb flux each second is the same as it would be through a fixed resistance larger than that of the actual resistor. One problem with this approach is that a fuel cell responds quite quickly to changes in resistance and tries to track the load. This can bias the results obtained in two ways. One of these is that a fuels cell's performance in a cycling system is not always the same as in a steady state system, even if the two systems have the same time averaged performance. Many types of batteries also show better performance under an intermittent load than a steady one and produce an overly optimistic result when tested under these conditions. The other bias is not in the cell, but in the measurement of the cell voltage under load with a fluctuating load. If the voltmeter being used doesn't average the voltage correctly at the chopper frequency being used the results will be incorrect. For example, a DC voltmeter used to measure a high frequency AC voltage will give a reading greater than the true root mean square (RMS) value, and this will lead to an overly optimistic and inaccurate result.

U.S. Pat. No. 5,512,831 (Cisar) teaches a controlled resistive load consisting of field effect transistors (FETs) operated in the linear region allowing them to function simply as a variable resistor. To increase the power dissipating or current carrying capacity of the overall load, a number of these matched FETs are placed electronically in parallel such that they share the load uniformly. Both the control signal and the applied current are connected in parallel, allowing the multitude of FETs to be controlled in unison by a single external electronic command.

In addition to a conventional FET based load, Cisar further adds the feature that the transistors are placed in a computer controlled feedback loop, in this feedback loop, a command signal is used to place the FETs in a predetermined location in their linear region where they will have a known resistance. The overall current through the electronic load is then measured and this signal digitized and sent back to the controlling computer. The controlling computer then trims or adjusts the FET control signal so that the measured current approaches the desired current. This control loop continues until the desired current is achieved in an iterative manner.

This type of load control operates in both theory and practice and has been demonstrated to be an effective means of accurately applying an electronically controlled load to an electrochemical energy conversion device. However the system suffers from two limitations; the first is merely a limitation in the performance while the second is a limitation in the durability of the components and system.

The first limitation stems from the slow, albeit controlled, response to changes in the applied load. This is entirely due to the time delay of having a purely digital control and feedback system, and from the iterative approach to finding the target resistance.

The second limitation is more critical in that as the initially matched FETs age, their characteristics change. Most importantly, a significant FET to FET variance in their turn-on voltage (which is already significantly wider than bipolar transistors since it is a difficult parameter to control in the production of the FET) will occur, changing the amount of current passed through the FET for a given gate voltage. For this particular application where the FETs are operated in parallel and primarily in their linear region, the matching of each FET's resistance versus the applied control voltage is extremely critical. Since each FET is given the same control voltage, any mismatch in the response to that control voltage will result in an individual FET having a higher or lower terminal resistance than the average of the entire FET bank. As expected from Ohm's law, the FETs having the lower resistance will shunt more of the current while the FETs having the higher resistance will shunt less current. To partially alleviate this problem, FETs have a positive temperature coefficient over the upper current portion of their operating range, meaning that as they get hotter, their resistance increases. This is in contrast to bipolar transistors which are more difficult to use in parallel because they have a negative temperature coefficient, i.e., their resistance decreases as their temperature increases. Therefore operating FETs in parallel over the saturated region is generally self limiting, i.e., the transistor that begins carrying additional current becomes hotter, resulting in a higher resistance and, in turn, resulting in a reduced current. Bipolar transistors, however, exhibit thermal runaway since as the component heats, its resistance decreases, further increasing the current through the device, and therefore further heating the device.

The difficulty in operating FETs in parallel occurs at their lower gate voltages and current settings since FETs have a negative temperature coefficient in that portion of their operating mode. In this low gate voltage region FETs exhibit thermal runaway just as exhibited by bipolar transistors. However, for the purpose of testing low voltage, high current devices (such as batteries and fuel cells), a large number of FETs must be placed in parallel to minimize their overall resistance. During operation of a load under low current conditions, these FETs are required to be at the very bottom of their linear region where the negative temperature coefficient is the largest. Therefore, a means of modifying the low current characteristics of each individual FET is necessary to prevent thermal runaway over the entire range of operation of the ultra-low resistance electronic load.

The most critical operating points are when the FETs are just above their threshold voltage where they are just beginning to turn on, and when they are approaching the boundaries of their safe operating area (SOA), beyond which they may become damaged or their operating lifetime shortened.

Therefore, methods of modifying the characteristics of FETs are required to prevent any individual component from passing excessive current which may shorten the component lifetime, change its operating characteristics, or cause it to be otherwise damaged or destroyed. Two methods of circuit compensation are generally used. Passive control, where passive components such as resistors, diodes, etc., are used, and active control where components such as transistors, op-amps, etc., are used.

One passive method utilizes components having a parameter, such as resistance, which is known to vary in a controlled and predictable manner in response to a second parameter such as temperature. In the low current portion of operation, FETs themselves are an example of a device having a negative temperature coefficient. In that region, at a given gate voltage FETs tend to become less resistive as their temperature increases and will therefore pass more current if the gate voltage and the applied voltage at the source and drain remain fixed. Utilizing one or more additional components having temperature coefficients opposite to, or the same as, the FET, allows a temperature compensating circuit to be constructed. This circuit can then be used to modify the behavior of the FET so that the performance of the FET remains predictable and preferably operates with a positive temperature coefficient over its entire range of operation. In this manner, the voltage being applied at the gate of the FET can be made to change in a manner that produces an overall effect that is comparable to, or larger than, any negative temperature coefficient inherent to FETs. This compensation modifies the gate voltage being applied to those FETs as they change temperature, allowing the FETs to participate equally in the current sharing of the load. A number of factors may be used to control the compensating circuit, most obvious of which are the current through the FET and the temperature of the FET.

A second method to match component characteristics is to modify the voltage being applied to the gate through an active means such as an operational amplifier (op-amp). In this active method of component matching, once again a component parameter, such as temperature, current, or voltage drop, is used to trim the gate voltage and therefore bring the FET resistance closer to the others in the load. This may be accomplished by placing the FET within a feedback circuit and using the result of that feedback circuit to control the FET. From there it is quite straightforward to implement an active circuit which prevents the FET from exceeding the boundaries of its SOA. This may be accomplished by summing with an external signal or otherwise modifying the gate voltage so that the maximum allowable current through the FET remains under a predetermined level.

However, it should be remembered that any number of parameters must remain within a window of operation if the FET is to perform over a reasonable lifetime. These include maximum power dissipation, gate voltage, applied forward voltage, reverse voltage, and temperature among others. When operated as an electronic load the FET must be operated in the safe operating area which may depend upon multiple parameters. As the limits of the SOA depends upon multiple factors, it becomes extremely difficult for a simple analog circuit to trim and adjust the relative current through each component as the number of input variables increases. As an example, the most common cause of exceeding the SOA in an electronic load are current and power dissipation but the boundaries of the SOA depend upon these variables as well as the source-drain voltage and the temperature of the FET itself. Therefore, a more sophisticated method of FET protection is needed when FETs are used in parallel for an electronic load. The preferred method will take all parameters into account to determine if any individual FET is approaching the SOA boundary, and prevent that single FET from leaving the SOA while continuing to manage the operation of the entire load.

SUMMARY OF THE INVENTION

The first embodiment of the invention is the application of a load bank control system having both a digital and an analog portion and utilizing the strengths of each type of control system to provide a more stable FET based electronic load. In the present invention, the FETs are placed within an analog feedback and control loop so that the current through the shunt, measured as a voltage, is compared in an analog manner to the control or setpoint voltage provided by the computer or digital controller. In this manner, very rapid tracking of the programmed current is possible since the analog electronics applied to this system have an upper frequency limit of tens of megahertz, being several times faster than the digital control system. As various dynamic factors change the operating conditions of the load bank, this analog feedback and control system is capable of maintaining the electronic load at a fixed current, but only for relatively short periods of time. For long term operation of the load, this analog control system is in turn controlled by a digital controller also provided with a feedback of the current through the load as well as other parameters such as applied voltage and the temperature of the heat sink. The advantages of the purely digital control taught by Cisar are retained in this invention since the more sophisticated compensation (due to the changing characteristics of the electronic components) is accomplished by software or programmable hardware. In other words, the digital portion of the control system serves to provide dynamic control of the load for programmed exercising of the device under test as well as compensation for drift of the analog components.

The present invention also addresses the current distribution problem associated with thermal runaway, component mismatch, and component drifting previously described as a limitation to the operation of FETs in parallel over their entire resistance range. A means of artificially matching the characteristics of multiple FETs, through the addition of external components, would allow the current to be distributed uniformly among the active FETs despite their natural tendency to have drastically different turn-on and operating characteristics. This may be achieved using a single method, or a combination of at least two methods, one entirely composed of passive components and the other an active method of load limiting or component matching.

Therefore, a second aspect of the invention provides a method of preventing an individual FET from exceeding the dynamic boundaries of the SOA. One method of accomplishing this is by adding passive components in a manner such that the temperature of the FET provides an influence to the gate voltage. Any number of resistive elements may be selected based on the sign and magnitude of their temperature coefficients or their reaction to current. These components are then designed into a circuit and this circuit placed in thermal communication with the FET being controlled. The combination of components having positive temperature coefficients (PTC, e.g., increasing resistance upon increasing temperature or current) and negative temperature coefficients (NTC, i.e., decreasing resistance upon increasing temperature or current) are used to provide a relative decrease in the gate voltage as the compensation circuit, and thus the FET, becomes warmer.

Therefore, the temperature of each individual FET, which is a combination of the power dissipation, ambient temperature, heat sink temperature, etc., is controlled according to the conditions at the present time. In operation, any FET that begins to shunt excessive current or dissipate excessive power will become hotter and the passive components will reduce the gate voltage causing the FET to become more resistive.

A limitation of the passive control system is the speed at which the compensation reacts, since the compensation is based on the case temperature of the FET. Therefore, the delay in temperature transfer from the junction to the case and from the case to the NTC and PTC components may allow short term periods of operation which exceed the SOA. An additional level of control may be provided with active components where any degree of sophistication may be envisioned. However, an electronic load may contain dozens of FETs operating in parallel and with one control signal, so the method of load sharing must be sufficiently inexpensive and simple so that it may be added to each FET without significantly increasing the system cost or complexity, or degrading reliability.

Therefore, another embodiment of the invention provides the addition of a simple current limiting circuit which functions as a chopper when the power being dissipated in any individual FET exceeds the SOA. This control operates by converting the current through the FET to a voltage across a resistive element, such as a shunt or fuse, and comparing that voltage to a SOA threshold voltage. When the voltage drop across the shunt exceeds the SOA threshold voltage, an amplifier or comparator reduces the gate voltage, thereby reducing the current through the FET and preventing the FET from exceeding the SOA. For systems having FETs of the same family (i.e., the same V-I and other operating characteristics), a single SOA threshold signal may be used by the protection circuit driving any number of FETs. For systems having a combination of FETs of different types or of different configuration operating in the same load bank, a SOA threshold signal may be generated for each family individually. As with the totally passive compensation described above, the real-time feedback and control of the electronic load by both the analog (short time scale holding circuit) and the digital (long term control) are both required to fully control the load bank.

Two aspects of this protection type circuit are critical to the operation of the system as a stable electronic load. The first is that the analog feedback and control loop must be sufficiently fast so that the chopping of an individual FET is compensated by the overall increase in the current load carried by the remaining FETs. This is easily accomplished by even a moderate feedback and control circuit and by slew rate control of the FET being chopped. The second aspect is that the threshold voltage is not a fixed voltage, but is a programmed voltage supplied by the computer or control system. This is critical since, as stated earlier, the threshold voltage depends upon several conditions including, but not limited to, the temperature of the heat sink and the voltage across the FET. Therefore, the control system monitors these parameters and adjusts the threshold voltage accordingly. This portion of the feedback loop is best controlled by software since any number of conditions, exemptions, and short term ventures out of the SOA may be taken into account when determining the threshold voltage.

As another embodiment of a local feedback mode of operation, each FET may be included in the feedback loop of an op-amp. In a manner similar to the analog control loop for the entire electronic load, this single FET feedback loop may be used to maintain each FET in the load bank within its SOA by comparing the current through the FET to the SOA threshold signal as in the chopper embodiment. Therefore, all drifting, variations in the threshold voltage, changes in the mobility of the carriers in the device, and all other changes in the operating characteristics may be eliminated. The FET shunts a well defined amount of current since the signal that is applied to the gate of the FET is controlled as a result of the current through that FET, the SOA threshold signal, and the digital and analog control loops.

In another aspect of the invention, the load bank may include power resistors in series with a subset of the FETs so that the power maybe dissipated from a resistive element in addition to the FET. This arrangement may have benefits, for example, in loads requiring large current capabilities, high voltage capabilities, or high power ratings. As with the heat sink of this invention, these resistors may be ambient- or water-cooled and may provide an overall lower cost form of heat dissipation than the FETs alone. The system could further be designed with a combination of FETs only and FETs or other switching elements in series with power resistors of different resistance, allowing the resistor banks to be used for coarse control and the FETs used for fine control between the coarse steps of individual resistors.

In yet another aspect, it may prove advantageous to operate the load bank where a large percentage of the switching elements are being operated in a chopping mode. This embodiment may have cost/performance advantages, as switching elements with higher capacities are required for larger load banks. As discussed by Cisar, switching type load banks are unsuitable for the testing of electrochemical devices since the device under test may be able to respond at the switching frequency of the load. However, the present invention is able to operate in a mode that may be referred to as "asynchronous switching" where each individual switching element is being chopped at the natural frequency of the chopper circuit. In this mode of operation the combination of all the switching elements switching asynchronously, the external analog control circuit and the external digital control circuit will result in a very stable current through the load which is suitable for the present application.

These and other features of the present invention will be apparent to those of skill in the art from a study of the following detailed description along with the accompanying drawings and figures.

BRIEF DESCRIPTION OF THE DRAWINGS

So that the above recited features and advantages of the present invention can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Preferred Structure

Figure 1:
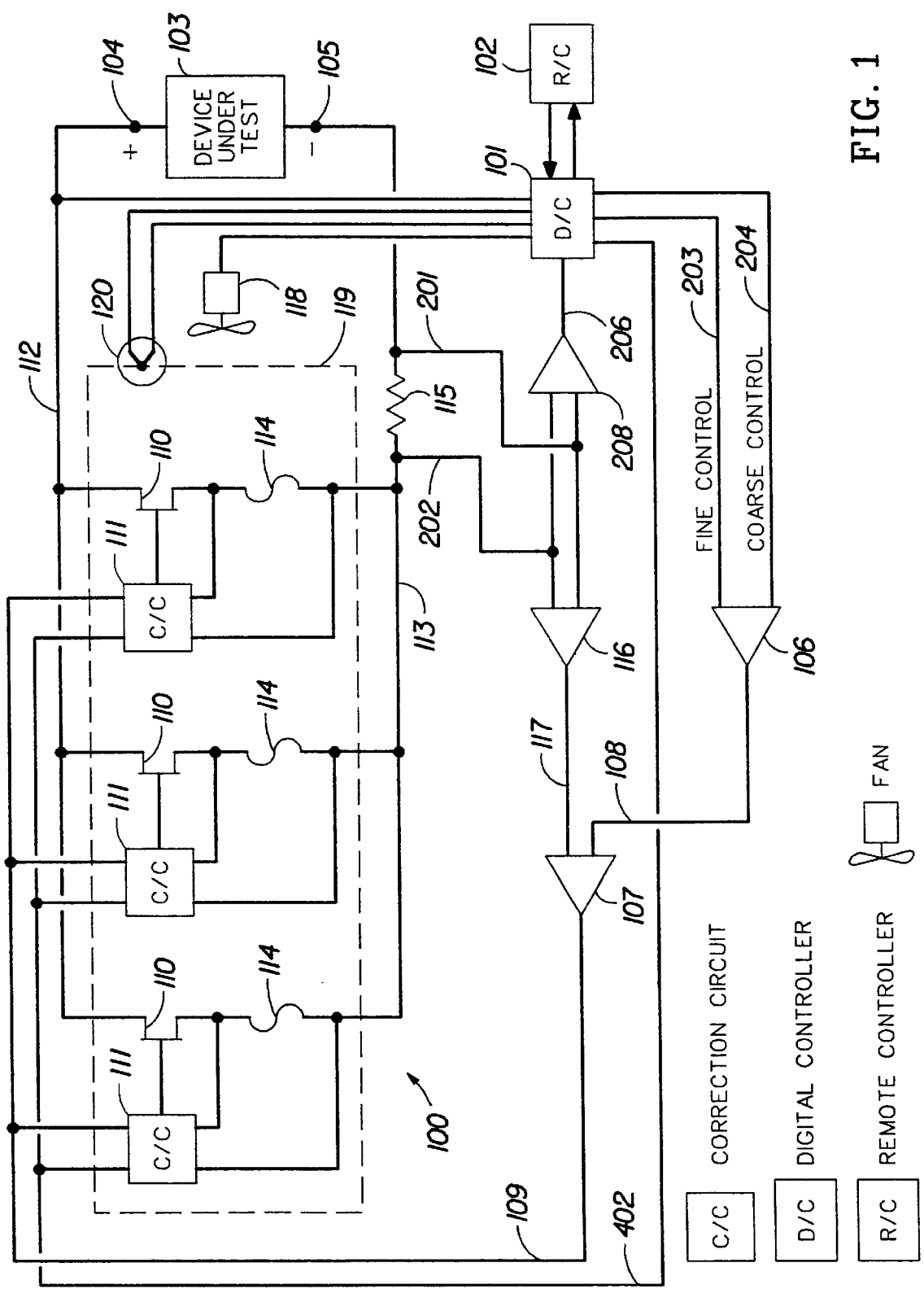
FIG. 1 is a schematic diagram of an electronically controlled load of this invention.

FIG. 1 is a system schematic diagram of a test system of this invention which includes an electronically controlled load 100 whose resistance is continuously variable over a wide range, from a minimum of approximately $R_{on}/n$ to a maximum of $R_{off}/n$, where n is the number of FETs in parallel and $R_{on}$ and $R_{off}$ are the full on and full off resistance of an individual FET 110. In full off, an FET very nearly provides an open circuit. This system is provided with both analog and digital feedback, as described below.

A digital controller 101, which may operate autonomously or as a slave to a remote controller 102, provides control and status of the electronic load 100. This electronic load is electrically connected to the output terminals of a device to be tested or device under test (DUT) 103, with a positive terminal (higher potential) 104 and a negative terminal (lower potential) 105.

When the DUT 103 is connected to the load 100, electric current flows from the positive to the negative terminal. The digital controller 101 provides a course control signal 204 and a fine control signal 203, which are summed by an amplifier 106. A sum 108 of the coarse and fine control signals is provided to a feedback amplifier 107. This control signal 108 provides the feedback amplifier 107 with a target voltage corresponding to the desired current to be drawn from the DUT 103. The feedback amplifier 107 adjusts its output 109, which is used to drive each of the gates of the multiple FETs in the load bank. This control signal may pass through a correction circuit 111, described below, which prevents any single FET from taking significantly more than its portion of the load current.

As the output 109 of the feedback amplifier 107 is increased, the voltage applied to the gates of the FETs 110 also increases, and thus the resistance of each FET 110 decreases. Greater current is thus drawn from a positive bus 112 and delivered to a negative bus 113 via fuses 114. This current returns to the device under test 103 through the negative bus 113, a shunt 115, and the negative terminal 105 of the device under test (DUT) 103.

The current through the shunt 115 provides a voltage drop that is measured and amplified by a difference amplifier 116. The difference amplifier's output 117 is provided to the feedback amplifier 107 where it is compared to the coarse and fine sum signal 108, which is the original program signal, and the output of the feedback amplifier 107 is thereby adjusted toward the target current. When the system reaches a stable state, the two inputs 108 and 117 of the feedback amplifier 107 are equal.

Using a thermocouple or other temperature sensing device 120, the controller monitors the temperature of a heatsink 119 which dissipates the heat generated by the FETs. To stabilize the electronics, the temperature of the heatsink 119 may be roughly controlled by the cycling of a fan 118 that is controlled by the controller 101 or a thermostat-type device. The temperature of the heatsink 119 is also provided as an input to the digital control system 101, and may therefore be used in the control algorithm to limit the power dissipation of the FETs as they approach their temperature limit where their maximum current handling capacity and power dissipation must be derated.

Figure 2:
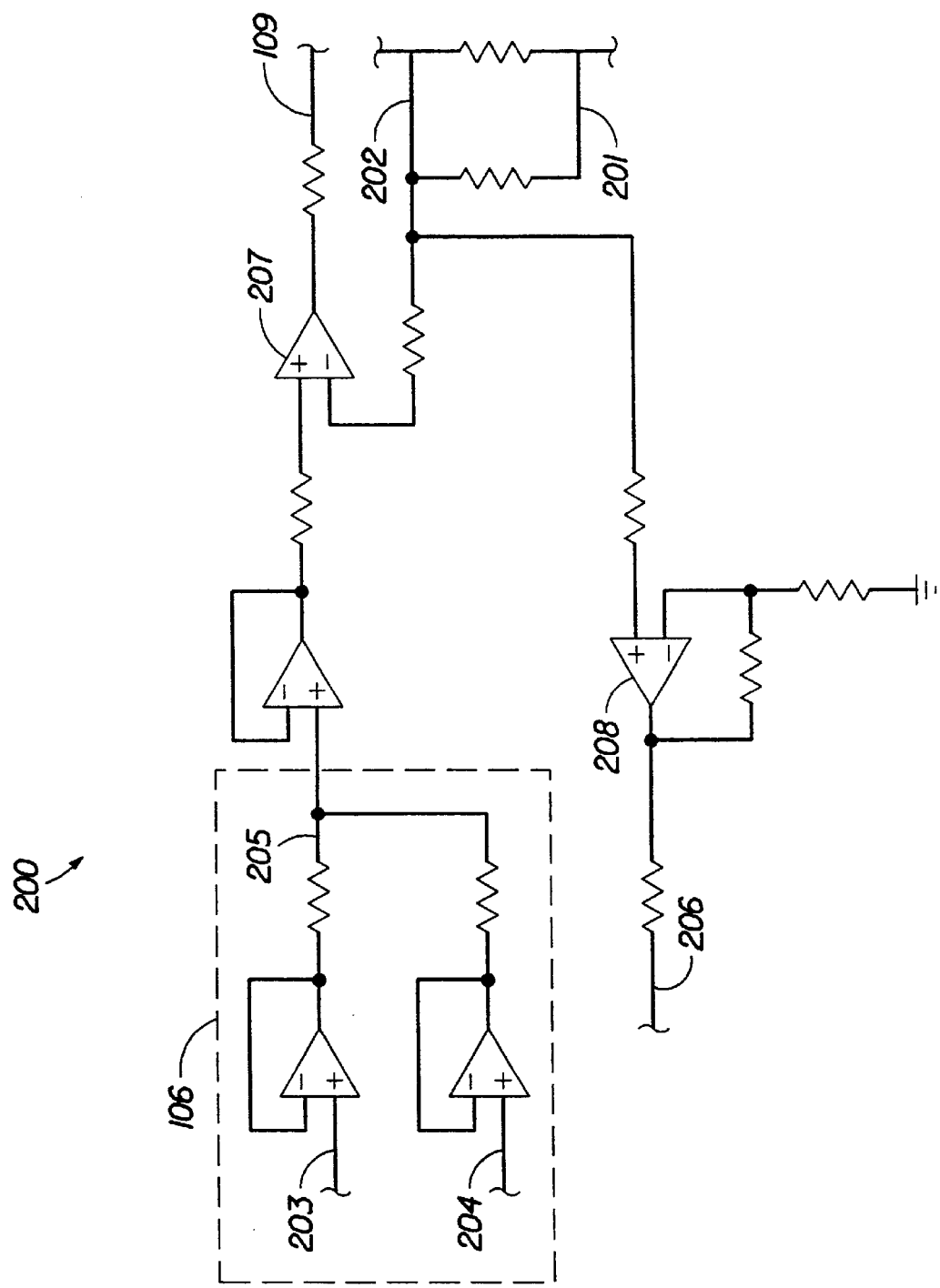
FIG. 2 is a detailed schematic diagram of an analog control circuit applicable to this invention.

FIG. 2 is a detailed schematic of a preferred analog control system used to match the current through the load to an analog current set point signal that is provided by an external source. The overall analog controller 200 provides three elements, among others, depicted in FIG. 1: (1) the coarse and fine summing circuit 106, (2) the difference amplifier 116, and (3) the feedback amplifier 107. In this simple circuit, the two control voltages from the digital controller (101 FIG. 1) providing the coarse control signal 204 and the fine control signal 203 are added to provide their sum 205. The voltage across the shunt 115, measured between nodes 202 and 201, is compared to the sum 205 and used to control the output of the feedback amplifier 107. The feedback amplifier 107 and the difference amplifier 116 are both accomplished by the single op-amp 207 and the supporting resistive elements.

The gate control voltage 109 generated by the op-amp 207 is used to control the gates of the FETs 110. An additional amplifier 208 is used to amplify the difference across the shunt 115 and provide this voltage signal 206 representing the shunt current to the system controller 101.

Figure 3:
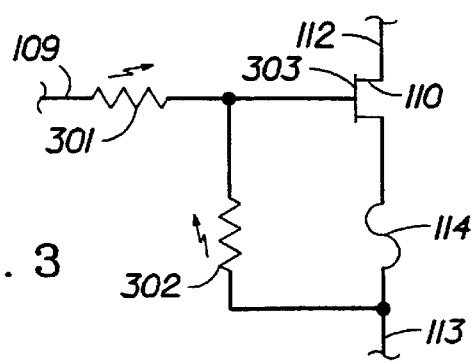
FIG. 3 is a detailed schematic diagram of a circuit providing a passive means of controlling the power dissipation in an individual FET to level power dissipation in a plurality of FETs.

FIG. 3 is a detailed schematic diagram of a compensation circuit which provides a passive means of controlling the power dissipation in an individual FET. That way, the power dissipation in the FET 110 remains approximately the same as the average dissipation of all the FETs. This allows unmatched FETs to be used in parallel and compensates for the change in characteristics as individual FETs age or are replaced. The compensation circuit is a portion of that previously shown in FIG. 1 as correction circuit 111.

In FIG. 3, the gate control voltage 109 is separated from the gate 303 by a resistor 301 having a known positive temperature coefficient (PTC); i.e., as resistor 301 heats, its resistance increases. Likewise, a second resistor 302 is placed between the gate 303 and the source. This component 302 is selected for its negative temperature coefficient (NTC). The FET 110 and the two resistors 301, 302 are placed in thermal communication and are all at approximately the same temperature. Therefore, as the temperature of the FET 110 increases, the gate control voltage 109 is divided across the voltage divider created by the two resistors 301 and 302. As the voltage being applied directly to the gate of the FET 303 decreases, the resistance of the FET increases and the current shunted between the positive bus 112 and negative bus 113 decreases. The power being dissipated by the FET then follows the current decrease, preventing the FET from passing excessive current or dissipating excessive power.

Figure 4:
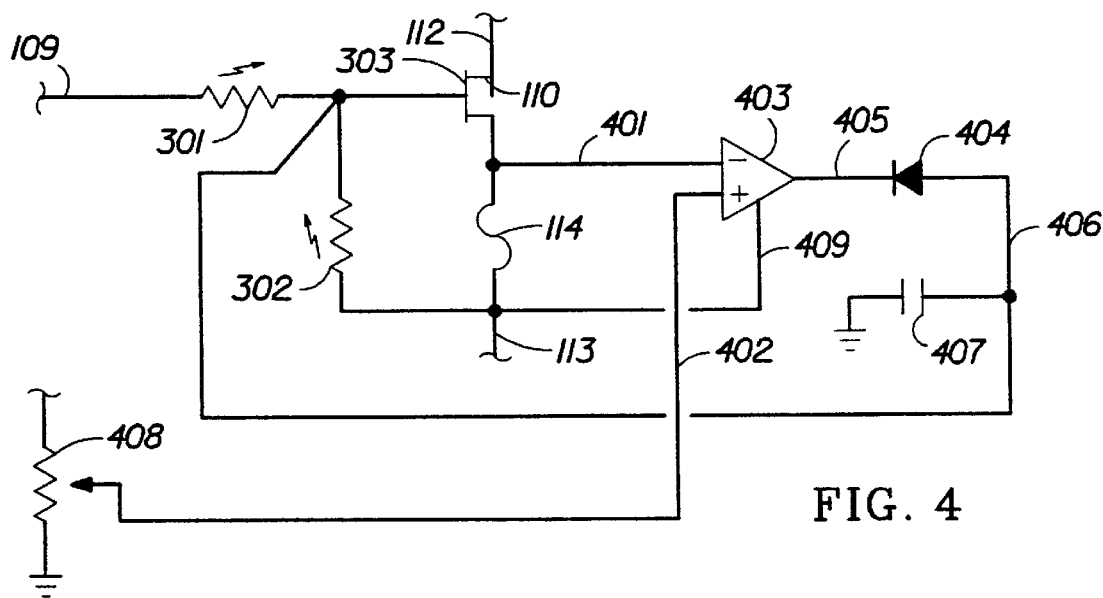
FIG. 4 is a detailed schematic diagram of a protection circuit which is applicable in the present invention.

FIG. 4 is a detailed schematic diagram of a FET protection circuit that prevents an individual FET from passing a current that is significantly more than a separately controlled threshold value. The protection circuit may be used in place of the circuit of FIG. 3. The threshold value or SOA threshold signal is provided by a voltage source or an external digital controller that takes a number of factors into account when assigning this current limit. As an enhancement to the passive control system of FIG. 3, the circuit of FIG. 4 provides an active protection circuit which limits the current passing through the FET.

The current passing through the FET 110 leaves the source terminal and passes through a fuse 114 generating a small potential difference. This fuse serves a dual purpose, i.e., to limit the current and to provide a voltage drop 401 that is proportional to the current. This voltage drop 401 is sensed by a comparator 403. The positive (non-inverting) input of the comparator 403 is a SOA threshold voltage that is provided by an external source 408 which may be a fixed resistor, or preferably originate from the control system 101 of FIG. 1. As current increases in the FET and associated fuse (or shunt) 114, the voltage 401 increases and may exceed the threshold voltage 402 supplied by the external source 408. Upon exceeding the threshold voltage 402, the output 405 of the comparator swings close to the low rail 409 of the comparator 403. The diode 404 is now forward biased and the comparator/diode output 406 brings the gate 303 to within a diode drop of the source bus 113. As the charge is drained from the gate, the FET begins to turn off. When the voltage drop across the fuse/shunt 114 is less than the threshold voltage 402, the comparator 403 swings high, the diode 404 is reverse biased and the FET is entirely controlled by the gate control voltage 109 being supplied by the analog feedback circuit 107 of FIG. 1.

This "notching" of the current through an individual FET results in a chopper mode of operation where the current is continually switched. In a similar manner, an analog component could be used in place of the comparator, allowing the voltage on the gate to be reduced rather than switched off. Likewise, an additional resistor between the output of the diode 404 and the gate 303 would allow the voltage on the gate to be reduced to a lesser extent. Additional filtering may be placed to modify the slew rate and other characteristics of the FET and the protection circuit.

The source of the threshold voltage 402 is shown in FIG. 4 as a simple adjustable voltage divider. This threshold voltage should be set according to the maximum current a single FET should carry under the present conditions. For example, under high voltage conditions such as a 20 volt applied load, the maximum power dissipated by ten FETs is approximately 2500 Watts or 250 watts each. This will occur when any individual FET is carrying 12.5 amps. Therefore, the threshold voltage is maintained by the system controller (101 of FIG. 1) at a voltage corresponding to 12.5 amps through the fuse/shunt 114. As the current of any individual FET crosses that threshold, the FET is temporarily turned off. When this FET is turned off, the gate control signal 109 to the remaining FETs increases, forcing the remaining FETs to conduct additional current. As more and more FETs approach the threshold limit and enter the switching mode of operation, those FETs which normally do not carry their portion of the current are brought further into conduction. Furthermore, as the temperature of the FET bank increases, as detected by the temperature sensor 120 in FIG. 1, the maximum current rating of the FET and the power dissipation rating must both be reduced. Through hardware measurements and software algorithms, the controller (101 of FIG. 1) is able to provide and enforce a maximum current or maximum power dissipation of that component. Since the controller 101 measures all pertinent variables, each FET 110 can be individually maintained within its safe operating area.

Figure 5:
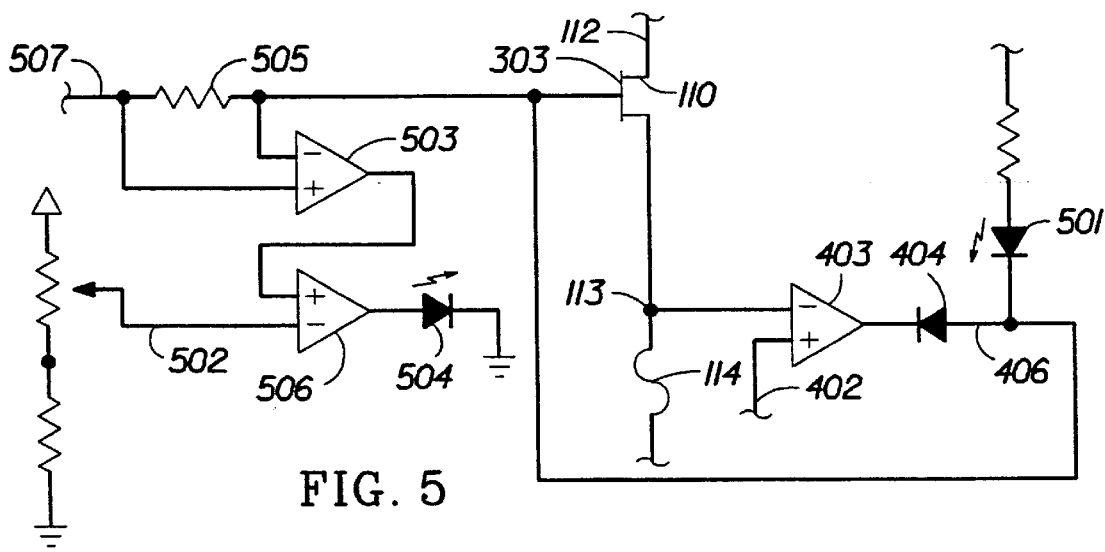
FIG. 5 is a detailed schematic of indicators for an FET operating out of specification.

FIG. 5 is a detailed schematic diagram of indicators that may be associated with each FET to provide a visual indication of which FETs are not operating within specifications. This figure shows an individual FET 110 without the protection circuitry of FIGS. 3 and 4. The potential drop across a suitable gate input resistor 505 is measured and the absolute value provided by amplifier 503. This signal is then compared to a reference voltage 502 by a comparator 506 whose output goes high when the voltage drop across the gate input resistor 505 exceeds a predefined level. The reference voltage 502 may be generated by a voltage divider as shown or by an external control system such as 101 shown in FIG. 1. LED 504 will then illuminate if the gate shorts to the drain and a voltage is applied to the electronic load that is higher than the control voltage 507. In a similar manner, LED 504 will illuminate if the gate within the FET has shorted to the source and the control voltage 507 is taken to a potential higher than the source.

The failure of an individual FET may be detected with the addition of a current limited LED 501 to the output signal of the comparator 403 described in FIG. 4. In the normal operation of the electronic load, the LED will be off. However, if the electronic load is programmed to pass a given current and then the threshold signal 402, usually used for individual FET protection, is lowered sufficiently, all FETs will exceed the threshold current and the comparator 403 will then begin chopping the current through the FET. This will result in the illumination of the LED 501 unless that individual FET has failed as an open circuit. Depending upon the operating parameters of the FET bank, the signal diode 404 may be replaced with a LED to eliminate the LED 501.

When the resistance of the load bank is uncontrollably low, a FET may have failed in a mode where the source and drain are shorted. In a testing sequence similar to the routine described above, shorted FETs may be identified. This is accomplished by attaching the load to a voltage source and programming the load bank to pass a minimal amount of current. Those FETs operating normally will turn off, but the current through the shorted FET will exceed the threshold value 402 and the LED 501 on the damaged FET will illuminate.

Figure 6:
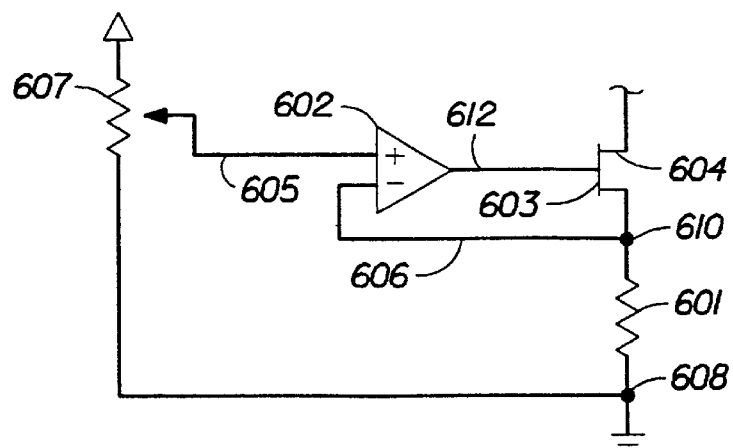
FIG. 6 is a detailed schematic diagram of a circuit providing active current control through each individual FET in the load bank.

FIG. 6 depicts another circuit which provides active load control for an individual FET which may be used as FET protection circuit 111 in FIG. 1 as a replacement for the circuit shown in FIG. 4. The circuit of FIG. 6 has an advantage over the method in FIG. 4 since the current is controlled over the entire range of operating conditions rather than simply current limiting the FET to prevent leaving the SOA.

Referring now to FIG. 6, a control signal 605 may originate from a simple voltage divider 607 or from another control system, such as the digital control system 101 of FIG. 1 or the analog control system 200 of FIG. 2. This control signal is provided at the positive input of an op-amp 602. In the simplest case, this control signal is referenced to a point that is common to the lower potential side 608 of a shunt 601. The higher potential side 610 of the shunt 601 is connected to both the current output of the FET as well as to the negative input of the op-amp. The output 612 of the op-amp 602 may be used directly to drive the gate 603 of the FET being controlled 604. In the simplest mode of operation, the control signal is adjusted and the op-amp increases the potential applied to the gate 603 until the voltage drop across the shunt is equal to the control signal 605.

Figure 7:
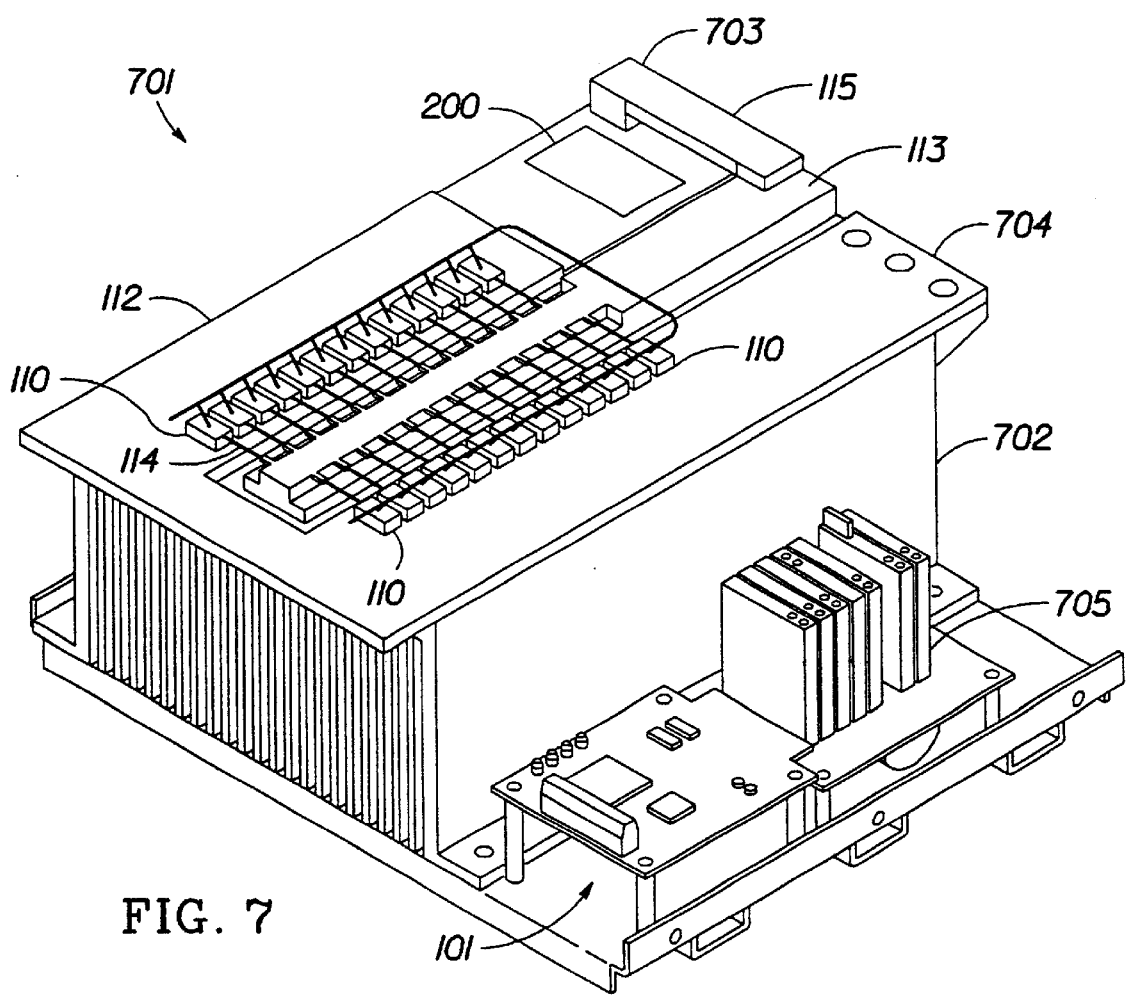
FIG. 7 is a perspective view of a chassis for retaining the various components of this invention.

FIG. 7 is a system diagram of a preferred configuration for an electronically controlled load having the features previously described. The electronic load 701 includes a heat sink 702 to dissipate the thermal energy that is generated as a result of consuming the electrical energy generated by the device under test. On the face of the heat sink are two copper bus bars 112 and 113 used to distribute the current among the 24 FETs 110 bolted or soldered to the bus bars. The positive terminal of the device under test is directly connected to the positive terminal 704 of the load 701. The negative terminal of the device under test is connected to negative terminal 703 of the shunt 115 (see also FIG. 1).

As previously described, the FETs 110 are bolted directly to the positive bus bar 112 which serves to electrically connect the drains of the FETs in parallel. Likewise, the sources of the FETs 110 are attached to fuses 114 which are attached to the negative bus bar 113 to connect the sources of the FETs in parallel. The positive bus is machined in the shape of a U with the negative bus bar running down the center of the U, allowing two rows of FETs to be connected to the negative bus bar 113. Both bus bars are electrically isolated from the heat sink 702 which is grounded to the system chassis. An embedded control system 101 is used to operate the load bank, and provide electrical input and output 705 to the analog control system 200, and the external control computer (102 FIG. 1).

As has now been described in detail, the present invention provides a plurality of field effect transistors (FETs) electrically in parallel to develop a well-controlled resistance to test electrochemical energy generation and storage devices. Such a device requires a low resistance provided by a large number of FETs in parallel for accurate characterization of the device under test.

Features of the Invention

A first feature or aspect of the present invention provides a protection circuit in a test load which prevents an FET in the load from passing a damaging amount of current or dissipating a destructive amount of power. Passive components having characteristic parameters that are a function of the component temperature or current provide this feature. As an example, one or more resistive elements having different temperature coefficients may be used to modify or override the signal provided to the FET. If an FET carries excessive current or dissipates excessive heat, the resistance of the components change so that the voltage applied to the FET's gate is decreased, turning the FET partially or fully off.

In another aspect of the invention, the resulting change in the resistance of the electronic load, due to the self regulation of each individual FET, is compensated by placing a portion of the electronic load within an analog feedback loop used to provide short term stabilization of the load circuit. This analog control system rapidly adjusts the control signal to all of the FETs within the electronic load based on the actual current passing through the entire load. In this manner, as an FET begins to self-compensate, to prevent leaving its safe operating area, the analog feedback loop tracks the fall in the current passing through the electronic load and increases the control signal to all the FETs so that the desired overall current is maintained.

In practice, this analog control system may be as simple as an operational amplifier having the negative input connected to a shunt in series with the electronic load and the positive input connected to a voltage source referenced to the other end of the shunt. The output of the op-amp may be directly connected to the gates of a number of FETs in parallel. The output signal from the op-amp will adjust in an attempt to keep the two inputs at the same voltage. If the shunt voltage is below the control voltage, the output of the op-amp will increase, thereby reducing the resistance of the FETs and increasing the current through the shunt. This system is stable to any perturbations and components may be selected to provide a response rate in the tens of MHz.

In a related aspect of the invention, the analog control system is provided with a control signal that is generated from a digital computer, digital signal processor (DSP), or other non-analog, programmable device. This digital system provides additional capabilities that are critical to the operation of a stable load. When the digital system is provided with signals indicating the value of the applied voltage to the electronic load, the current through the load, the temperature of the heat sink, and other desired operating parameters, the operation of the load may be more strictly controlled. Internal software or hardware algorithms may be used to compensate for drifts within the system due to heating and aging, to protect the system from excessive currents or voltages, to protect the device under test, automate any number of routine test procedures, and to evaluate the performance of the electronic load.

As a specific example, the digital control system may calculate the total power being dissipated by the electronic load and modify its control signal to the FETs to prevent them from being operated outside their safe operating area. Likewise, the digital control system can automatically derate the power dissipation or current ratings of the devices based on their temperature and lower the control voltage applied to the FETs so that they may stay within their SOA for that operating temperature.

Even with the passive compensation detailed earlier, some FETs will have operating characteristics that are incompatible with the remainder of the FETs in the system. This becomes most apparent when multiple FETs are operated in parallel since, like bipolar transistors, FETs do not always naturally proportion current. Therefore an FET having a lower resistance or a lower threshold voltage will conduct more current and will self heat due to its voltage drop. When operated in the low current region of the linear region, self heating causes the resistance in the FET to decrease, which in turn causes the FET to go further into conduction and pass higher amounts of current. If the applied potential is sufficiently high, even with low currents, if there is no self limiting mechanism, this cycle will continue until the FET is destroyed when it crosses the dissipation limit of the SOA.

In another aspect of the invention, an active means of controlling the maximum amount of power dissipated by a single FET is employed to prevent run away of poorly matched FETs in parallel. Utilizing the digital controller, the total power being dissipated by the electronic load can be maintained within the safe operating area of the load bank. Furthermore, the applied voltage and the temperature of the heatsink may be used in digital algorithms to define a safe operating area threshold current over which no single FET should operate. This SOA threshold current can then be compared to the current passing through each individual FET and the operation of those FETs exceeding the maximum SOA current may be modified. This protection scheme may be implemented in a simple and cost effective manner since the SOA threshold current is determined by the digital controller as a result of the present operating conditions and the internal algorithms. Furthermore, the entire FET bank can operate from the same SOA threshold signal since that signal is tailored and modified on a real time basis. Ideally, the threshold signal is in a form that is easily used to control the operation of an individual FET. An example would be a voltage whose value in millivolts matches the threshold current in amps.

Another aspect of the invention is the active circuit which, coupled to the SOA threshold control signal, serves to protect the FET from operating outside the SOA. This is easily accomplished by placing a known resistance in series with the FET, measuring the voltage drop across that resistance, and comparing this voltage drop to the voltage provided by the SOA threshold signal. When the voltage drop across the known resistance, or shunt, exceeds the SOA threshold voltage, the operation of the FET must be changed to keep the FET within the safe operating area. The protection circuitry may be simplified if the FETs are connected in such a manner that all of the shunts used to measure the current through each FET have a common voltage on one side of the shunt. In addition to being electrically bonded together, it simplifies the active control system if the SOA threshold voltage is then referenced to this same bonding point. This further simplifies the individual protection circuits since they are all referenced to the same voltage and the input to the shunt on each FET may be directly compared to the SOA threshold voltage provided by the digital controller.

In a related aspect of the invention, the relative values of the threshold signal and the actual current through an individual FET may be used to modify or override the control signal being generated by an external control system. In one possible embodiment of the invention, when the current through the FET increases beyond the threshold value, a variable gain amplifier may be used in line with the gate control signal to reduce the voltage being applied to the gate. In another embodiment, each individual FET may be placed within its own analog control loop operating in a manner very similar to the analog feedback and control loop used to current stabilize the entire load bank. Adjustments in the relative bandwidth or response time of the two analog control loops will prevent the oscillations of the inner loop from coupling to the outer loop. This single FET controller may hold the FET in a constant current configuration. The remaining FETs that are operating well within their SOA may then be adjusted to set the overall load current. In the preferred embodiment, the threshold signal and the voltage generated across the shunt of the individual FET are simply compared. If the current through the FET is above the threshold current, the FET may be cycled off for a short time and immediately allowed to turn back on. In this mode of operation, that FET becomes a buck converter or a DC chopper. The operation of the FET remains within the safe operating area defined by the SOA threshold signal.

As an additional aspect of the invention, the individual protection circuitry may be expanded to include one or more diagnostic indicators or test points. Generally, a FET will fail in one of three modes: the FET may fail to conduct, it may fail to stop conducting, or the gate may become shorted to either the source or the drain. The addition of an LED or other indicator to the output of the comparator used to turn the FET off when the FET current exceeds the SOA threshold current, will serve to identify any FET which has failed to a low resistance mode. In this mode where the FET will not stop conducting, applying a voltage to the load at the device under test terminals will result in a current in excess of the programmed current and therefore in excess of the threshold current. On this occasion, the LED on the shorted FET will illuminate, simplifying diagnostics. In another mode of operation, a FET that has failed to an open circuit may be detected by applying a load, adjusting the control signal so that all FETs are conducting, and then lowering the threshold voltage. As the threshold voltage is lowered, those FETs which are operational will switch to a chopper mode of operation while those FETs that have failed to an open circuit will not exceed the threshold current and their LED will remain off. Additionally, in normal operation, the intensity of the LED will serve to indicate how frequently the FET exceeds the threshold current.

To detect the last mode of failure, a suitable amplifier across a resistor in the gate circuit can be used to detect when the gate of an individual FET has shorted to either the source or drain. During most DC operating conditions the input impedance to the gate is very high and the voltage drop across a gate input resistor is minimal. However, when the gate shorts to either the source or the drain, the potential on the gate will no longer track the control signal, but will closely follow the source or drain voltage as the case may be. Detecting this voltage across an input resistor and using that signal to provide a visual indication would reduce the time required for diagnostics of an inoperable load.

Preferred Specific Components

An apparatus with a safe operating area bounded by 20 volts, 1,000 amps, and 1,000 watts is described below. The apparatus containing the embodiments of this invention has been fabricated and the performance of the apparatus described in this invention has been verified.

A 1,000 Watt aluminum heat sink with bonded fins and forced air cooling serves as the primary mounting for all components in the system. This heat sink is fitted with two copper bus bars, one passing down the center of the heat sink for contact to the low potential (negative) terminal of the device under test, and one forming a U shape around this center bus bar for attachment of the higher potential (positive) terminal of the device under test. Both bus bars serve to distribute the current among the 26 FETs (part number RFG75N05E, Harris Semiconductor. Melbourne, Fla.) which are mounted to the positive bus and have terminals extending towards the negative bus. Both buses extend beyond the back of the cabinet of the electronic load for connection to the device under test (DUT). A 100 mV standard resistive shunt or other current indicating device is placed in series with the DUT and used to provide feedback to both the analog and digital load controllers (via an analog input module 73GIV5, Grayhill. LaGrange, Ill.). Various shunt ratings may be used to closely match the maximum load to the shunt, providing the highest accuracy feedback for the controllers. A digital control system (Grayhill, MicroDAC) provides the control of the system and acts as a slave to a personal computer which provides the interface to the user.

The temperature of the heat sink is provided by a thermocouple and an appropriate thermocouple input device (Grayhill 73GITCK). This temperature is provided to the digital controller for use as an input parameter to determine the threshold voltage.

Two analog signals (each via Grayhill 73GOV5) are supplied by the digital controller (Grayhill MicroDAC) to the analog controller that combines these voltages and sends a control voltage to each of the 26 FETs wired in parallel. In a negative feedback manner, this analog controller compares the digitally generated program voltage to the voltage drop across the shunt and increases or decreases the FET gate control voltage as necessary to maintain the desired current through the load.

One negative temperature coefficient and one positive temperature coefficient electronic components are thermally bonded to each FET using epoxy (part number 16100DF00 available from Aavid Engineering, Laconia, N.H.) to refine the gate control voltage based on the body temperature of the FET. The PTC component (part number RL3006-50-50-25PTO manufactured by Keystone Thermometrics, Edison, N.J.) is placed between the gate control voltage and the gate, and the NTC component (part number 334-47204 available from Mouser Electronics, Mansfield, Tex.) is placed between the gate and the negative bus. As the FET heats, the PTC component becomes more resistive, decreasing the influence of the gate control voltage, and the NTC component pulls the gate voltage towards the voltage of the negative bus.

Each of the 26 FETs mounted to the positive bus takes current from the positive bus through the tab (internally connected to the FET drain) and this current flows out the source terminal when the voltage on the gate is such that current will flow. A current shunt, in the form of four 15 amp fuses (R251015 available from Littelfuse, Des Plaines, Ill.) wired in parallel, both protects the FET from excessive current and provides a voltage indication of the current exiting the FET.

A second digitally generated, analog control voltage, referred to as the threshold voltage, is provided by the digital controller (via a Grayhill 73GOV5). The gate of each FET is connected to the output of the protection circuit (through a light emitting diode) which compares the threshold voltage to the voltage drop across the fuses. When the voltage drop across the fuses exceeds the threshold voltage, the output of the comparator (MAX921 available from Maxim, Sunnyvale, Calif.) goes to its negative input (common or ground) and the gate is pulled within a diode drop of the output of the comparator. The entire control voltage is then dropped across the gate resistor (or the gate resistor plus the PTC) and the FET switches partially or entirely off. While not implemented in this design, additional components could be included to control the turn off slew rate of the FET. Upon turning off, the external analog feedback loop increases the gate control voltage delivered to all the FETs, and the current through each FET increases such that the total current through the load remains constant. Immediately upon shutting off, the voltage drop across the fuses is now below the threshold voltage and the comparator swings to its positive rail. The diode is now reverse biased and the gate resistor is allowed to charge the capacitor and gradually increase the voltage being applied to the gate of the FET and thereby increase the current through the FET. The positive slew rate of the gate voltage may be controlled by adjusting the capacitor and resistors in the circuit. As the FET begins to carry additional current, it may once again approach the SOA and the threshold voltage will cause the FET to turn off. This sequence may occur quite rapidly, in effect forming a chopper which passes a maximum current, which is held below an upper limit, while passing a sufficient average current to significantly share the overall current passed by the load. However, in contrast to a conventional chopper (buck converter), the local analog controller provides continuous load correction at a rate higher than the switching frequency of the chopper circuit on each individual FET. This, coupled with the fact that any number of FETs may be in this chopping mode and their switching is completely asynchronous serves to minimize or eliminate any oscillation in the resistance of the load.

While the foregoing is directed to the preferred embodiment of the present invention, other and further embodi-

What is claimed is:

1. A system for testing an energy generation device, the system comprising:
   a load comprising a plurality of field effect transistors coupled in parallel, the load including a positive input terminal and a negative input terminal;
   a pair of electrical nodes to receive an energy generation device under test, with a first node coupled to the positive input terminal of the load, and a second node coupled to the negative input terminal of the load through a resistive element;
   a means for sensing the voltage drop across the resistive element;
   a difference amplifier to receive the sensed voltage drop across the resistive element and to provide an output which is a function of the sensed voltage drop; and
   a feedback and control loop to receive the output of the difference amplifier and a control signal from a control element, the feedback and control loop providing an input to the load.

2. The system of claim 1, further comprising a protection circuit in a load adapted to test an electrical energy generation device, the circuit comprising:
   means for sensing one or more operational parameters of one of the field effect transistor in the load; and
   means for adjusting the current through the field effect transistor in response to the one or more sensed parameters to prevent the transistor from operating outside its safe operating area.

3. The system of claim 2, wherein the protection circuit parameter comprises operating current.

4. The system of claim 2, wherein the protection circuit parameter comprises a temperature.

5. The system of claim 2, wherein the protection circuit further comprises:
   means for sensing one or more operational parameters of each of the plurality of field effect transistors in the load individually; and
   means for adjusting the current through each of the plurality of field effect transistors individually in response to the respective one or more sensed parameters.

6. The system of claim 2, wherein the means for sensing are components having a characteristic parameter that is a function of the operational parameter.

7. The system of claim 6, wherein one of the one or more operational parameters is temperature.

8. The system of claim 6, wherein one of the one or more operational parameters is current.

9. The system of claim 2, wherein the protection circuit means for sensing comprises a resistor having a predetermined temperature coefficient.

10. The system of claim 2, wherein the protection circuit further comprises an analog feedback loop in the load whose output changes with changes in the resistance of the load.

11. The system of claim 10, wherein the feedback loop comprises:
   a shunt in series with the field effect transistor;
   an operational amplifier having its inverting input coupled to one end of the shunt; and
   the non-inverting input of the operational amplifier coupled to a voltage source referenced to the other end of the shunt.

12. The system of claim 11, wherein the output of the operational amplifier provides a control signal to the gates of the field effect transistors of the load.

13. The system of claim 10, further comprising a digital programmable device providing a control signal to the analog feedback loop to alter the operation of the feedback loop.

14. The system of claim 1, further comprising an amplifier to receive the sensed voltage drop across the resistive element and to provide an output to the control element, whereby the control element alters the first control signal to the first input of the load in response to a change in the sensed voltage drop.

15. The system of claim 1, further comprising a temperature sensor for sensing the operational temperature of the field effect transistors and to provide a sensed temperature signal to the control element to alter the control signal to the input of the load in response to a change in the sensed temperature.

16. The system of claim 15, wherein the load further comprises one or more power resistors in series with one or more of the plurality of field effect transistors.

17. The system of claim 1, wherein the load further comprises one or more power resistors in series with one or more of the plurality of field effect transistors.

18. A system for testing an energy generation device, the system comprising:
   a load comprising a plurality of field effect transistors coupled in parallel, the load including a positive input terminal and a negative input terminal;
   a pair of electrical nodes to receive an energy generation device under test, with a first node coupled to the positive input terminal of the load, and a second node coupled to the negative input terminal of the load;
   a means for sensing the current through the load;
   a control element coupled to the positive input terminal of the load, the control element further providing a first control signal to a first input to the load; and
   a feedback amplifier to receive the signal from the means for sensing the current and a second control signal from the control element, the feedback amplifier providing a second input to the load.

19. The system of claim 18, further comprising an amplifier to receive the signal from the means for sensing current and to provide an output to the control element, whereby the control element alters the first control signal to the first input of the load in response to a change in the sensed current.

20. The system of claim 18, further comprising a temperature sensor for sensing the operational temperature of the field effect transistors and to provide a sensed temperature signal to the control element to alter the first control signal to the first input of the load in response to a change in the sensed temperature.

21. The system of claim 18, further comprising a protection circuit in a load adapted to test an electrical energy generation device, the circuit comprising:
   means for sensing one or more operational parameters of one of the field effect transistors in the load; and
   means for adjusting the current through the field effect transistor in response to the one or more sensed parameters to prevent the transistor from operating outside its safe operating area.

22. The system of claim 18, wherein the protection circuit parameter comprises operating current.

23. The system of claim 18, wherein the protection circuit parameter comprises a temperature.

24. The system of claim 18 wherein the protection circuit further comprises:
  means for sensing one or more operational parameters of each of the plurality of field effect transistors in the load individually; and
  means for adjusting the current through each of the plurality of field effect transistors individually in response to the respective one or more sensed parameters.

25. The system of claim 21, wherein the means for sensing are components having a characteristic parameter that is a function of the operational parameter.

26. The system of claim 25, wherein one of the one or more operational parameters is temperature.

27. The system of claim 25, wherein one of the one or more operational parameters is current.

28. The system of claim 21, wherein the protection circuit means for sensing comprises a resistor having a predetermined temperature coefficient.

29. The system of claim 21, wherein the protection circuit further comprises an analog feedback loop in the load whose output changes with changes in the resistance of the load.

30. The system of claim 29, wherein the feedback loop comprises:
  a current sensing device in series with the field effect transistor; and
  an operational amplifier having a first input receiving a signal from the current sensing device and a second input coupled to a voltage source.

31. The system of claim 27, wherein the current sensing device is a shunt.

32. The system of claim 27, wherein the output of the operational amplifier provides a control signal to the gates of the field effect transistors of the load.

33. The system of claim 29, further comprising a digital programmable device providing the second control signal to the analog feedback loop to alter the operation of the feedback loop.

34. The system of claim 18, wherein the load further comprises one or more power resistors in series with one or more of the plurality of field effect transistors.

35. A system for testing an energy generation device, the system comprising:
  a load comprising a plurality of field effect transistors coupled in parallel, the load including a positive input terminal and a negative input terminal;
  a pair of electrical nodes to receive an energy generation device under test, with a first node coupled to the positive input terminal of the load, and a second node coupled to the negative input terminal of the load;
  a means for sensing the current through the load;
  a feedback and control loop to receive the signal from the means for sensing the current and a control signal from a control element, the feedback and control loop providing an input to the load; and
  a temperature sensor for sensing the operational temperature of the field effect transistors and to provide a sensed temperature signal to the control element to alter the control signal to the input of the load in response to a change in the sensed temperature.

36. The system of claim 35, further comprising a protection circuit in a load adapted to test an energy generation device, the circuit comprising:
  means for sensing one or more operational parameters of one of the field effect transistors in the load; and
  means for adjusting the current through the field effect transistor in response to the one or more sensed parameters to prevent the transistor from operating outside its safe operating area.

37. The system of claim 36, wherein the protection circuit parameter comprises operating current.

38. The system of claim 36, wherein the protection circuit parameter comprises a temperature.

39. A system for testing an energy generation device, the system comprising:
  a load comprising a plurality of field effect transistors coupled in parallel, the load including a positive input terminal and a negative input terminal;
  a pair of electrical nodes to receive an energy generation device under test, with a first node coupled to the positive input terminal of the load, and a second node coupled to the negative input terminal of the load;
  a means for sensing the current through the load;
  a feedback and control loop to receive the signal from the means for sensing the current and a control signal from a control element, the feedback and control loop providing an input to the load; and
  a protection circuit in a load adapted to test an energy generation device, the circuit comprising:
    means for sensing one or more operational parameters of one of the field effect transistors in the load; and
    means for adjusting the current through the field effect transistor in response to the one or more sensed parameters to prevent the transistor from operating outside its safe operating area.

40. The system of claim 39, wherein the protection circuit parameter comprises operating current.

41. The system of claim 39, wherein the protection circuit parameter comprises a temperature.

42. The system of claim 39, wherein the protection circuit further comprises:
  means for sensing one or more operational parameters of each of the plurality of field effect transistors in the load individually; and
  means for adjusting the current through each of the plurality of field effect transistors individually in response to the respective one or more sensed parameters.

43. The system of claim 39, wherein the means for sensing one or more operational parameters are components having a characteristic parameter that is a function of the operational parameter.

44. The system of claim 39, wherein one of the one or more operational parameters is temperature.

45. The system of claim 44, wherein one of the one or more operational parameters is current.

46. The system of claim 39, wherein the protection circuit means for sensing comprises a resistor having a predetermined temperature coefficient.

47. The system of claim 39, wherein the protection circuit further comprises an analog feedback loop in the load whose output changes with changes in the resistance of the load.

48. The system of claim 47, wherein the feedback loop comprises:
  a current sensing device in series with the field effect transistor; and
  an operational amplifier having a first input receiving a signal from the current sensing device and a second input coupled to a voltage source.

49. The system of claim 48, wherein the current sensing device is a shunt.

50. The system of claim 48, wherein the output of the operational amplifier provides a control signal to the gates of the field effect transistors of the load.

51. The system of claim 47, further comprising a digital programmable device providing the second control signal to the analog feedback loop to alter the operation of the feedback loop.

52. The system of claim 39, further comprising an amplifier to receive the signal from the means for sensing current and to provide an output to the control element, whereby the control element alters the control signal to the load in response to a change in the sensed current.

53. A system for testing an energy generation device, the system comprising:
   a load comprising a plurality of field effect transistors coupled in parallel, the load including a positive input terminal and a negative input terminal;
   a pair of electrical nodes to receive an energy generation device under test, with a first node coupled to the positive input terminal of the load, and a second node coupled to the negative input terminal of the load through a resistive element;
   a means for sensing the voltage drop across the resistive element;
   a difference amplifier to receive the sensed voltage drop across the resistive element and to provide an output which is a function of the sensed voltage drop;
   a feedback and control loop to receive the output of the difference amplifier and a control signal from a control element, the feedback and control loop providing an input to the load; and
   a protection circuit in a load adapted to test an electrical energy generation device, the circuit comprising:
      means for sensing one or more operational parameters of one of the field effect transistor in the load; and
      means for adjusting the current through the field effect transistor in response to the one or more sensed parameters to restrict the transistor to operating within its safe operating area.

54. The system of claim 53, wherein the protection circuit parameter comprises operating current.

55. The system of claim 53, wherein the protection circuit parameter comprises a temperature.

56. The system of claim 53, wherein the protection circuit further comprises:
   means for sensing one or more operational parameters of each of the plurality of field effect transistors in the load individually; and
   means for adjusting the current through each of the plurality of field effect transistors individually in response to the respective one or more sensed parameters.

57. The system of claim 53, wherein the means for sensing are components having a characteristic parameter that is a function of the operational parameter.

58. The system of claim 57, wherein one of the one or more operational parameters is temperature.

59. The system of claim 57, wherein one of the one or more operational parameters is current.

60. The system of claim 53, wherein the protection circuit means for sensing comprises a resistor having a predetermined temperature coefficient.

61. The system of claim 53, wherein the protection circuit further comprises an analog feedback loop in the load whose output changes with changes in the resistance of the load.

62. The system of claim 61, wherein the feedback loop comprises:
   a shunt in series with the field effect transistor;
   an operational amplifier having its inverting input coupled to one end of the shunt; and
   the non-inverting input of the operational amplifier coupled to a voltage source referenced to the other end of the shunt.

63. The system of claim 62, wherein the output of the operational amplifier provides a control signal to the gates of the field effect transistors of the load.

64. The system of claim 61, further comprising a digital programmable device providing a control signal to the analog feedback loop to alter the operation of the feedback loop.

65. The system of claim 53, further comprising an amplifier to receive the sensed voltage drop across the resistive element and to provide an output to the control element, whereby the control element alters the first control signal to the first input of the load in response to a change in the sensed voltage drop.

66. The system of claim 53, wherein the load further comprises one or more power resistors in series with one or more of the plurality of field effect transistors.

67. A system for testing an energy generation device, the system comprising:
   a load comprising a plurality of field effect transistors coupled in parallel, the load including a positive input terminal and a negative input terminal;
   a pair of electrical nodes to receive an energy generation device under test, with a first node coupled to the positive input terminal of the load, and a second node coupled to the negative input terminal of the load through a resistive element;
   a means for sensing the voltage drop across the resistive element;
   a difference amplifier to receive the sensed voltage drop across the resistive element and to provide an output which is a function of the sensed voltage drop;
   a feedback and control loop to receive the output of the difference amplifier and a control signal from a control element, the feedback and control loop providing an input to the load; and
   a temperature sensor for sensing the operational temperature of the field effect transistors and to provide a sensed temperature signal to the control element to alter the control signal to the input of the load in response to a change in the sensed temperature.

68. The system of claim 67, wherein the load further comprises one or more power resistors in series with one or more of the plurality of field effect transistors.

69. A system for testing an energy generation device, the system comprising:
   a load comprising a plurality of field effect transistors coupled in parallel, the load including a positive input terminal and a negative input terminal;
   a pair of electrical nodes to receive an energy generation device under test, with a first node coupled to the positive input terminal of the load, and a second node coupled to the negative input terminal of the load;
   a means for sensing the current through the load;
   a control element coupled to the positive input terminal of the load, the control element further providing a first control signal to a first input to the load;
   a feedback amplifier to receive the signal from the means for sensing the current and a second control signal from the control element, the feedback amplifier providing a second input to the load; and a temperature sensor for sensing the operational temperature of the field effect transistors and to provide a sensed temperature signal to the control element to alter the first control signal to the first input of the load in response to a change in the sensed temperature.

70. A system for testing an energy generation device, the system comprising:

a load comprising a plurality of field effect transistors coupled in parallel, the load including a positive input terminal and a negative input terminal;

a pair of electrical nodes to receive an energy generation device under test, with a first node coupled to the positive input terminal of the load, and a second node coupled to the negative input terminal of the load;

a means for sensing the current through the load;

a control element coupled to the positive input terminal of the load, the control element further providing a first control signal to a first input to the load;

a feedback amplifier to receive the signal from the means for sensing the current and a second control signal from the control element, the feedback amplifier providing a second input to the load; and a protection circuit in a load adapted to test an electrical energy generation device, the circuit comprising:
means for sensing one or more operational parameters of one of the field effect transistors in the load; and
means for adjusting the current through the field effect transistor in response to the one or more sensed parameters to restrict the transistor to operating within its safe operating area.

71. The system of claim 70, wherein the protection circuit parameter comprises operating current.

72. The system of claim 70, wherein the protection circuit parameter comprises a temperature.

73. The system of claim 70 wherein the protection circuit further comprises:

means for sensing one or more operational parameters of each of the plurality of field effect transistors in the load individually; and means for adjusting the current through each of the plurality of field effect transistors individually in response to the respective one or more sensed parameters.

74. The system of claim 70, wherein the means for sensing are components having a characteristic parameter that is a function of the operational parameter.

75. The system of claim 74, wherein one of the one or more operational parameters is temperature.

76. The system of claim 74, wherein one of the one or more operational parameters is current.

77. The system of claim 70, wherein the protection circuit means for sensing comprises a resistor having a predetermined temperature coefficient.

78. The system of claim 70, wherein the protection circuit further comprises an analog feedback loop in the load whose output changes with changes in the resistance of the load.

79. The system of claim 78, wherein the feedback loop comprises:

a current sensing device in series with the field effect transistor; and an operational amplifier having a first input receiving a signal from the current sensing device and a second input coupled to a voltage source.

80. The system of claim 78, wherein the current sensing device is a shunt.

81. The system of claim 78, wherein the output of the operational amplifier provides a control signal to the gates of the field effect transistors of the load.

82. The system of claim 77, further comprising a digital programmable device providing the second control signal to the analog feedback loop to alter the operation of the feedback loop.

83. The system of claim 70, wherein the load further comprises one or more power resistors in series with one or more of the plurality of field effect transistors.

84. The system of claim 70, wherein the safe operating area is dynamically determined from the one or more sensed parameters.

* * * * *